US012411174B2

(12) United States Patent
Ng et al.

(10) Patent No.: US 12,411,174 B2
(45) Date of Patent: Sep. 9, 2025

(54) CIRCUITS AND METHODS FOR CONFIGURABLE SCAN CHAINS

(71) Applicant: Intel Corporation, Santa Clara, CA (US)

(72) Inventors: Bee Yee Ng, Penang (MY); Ilya Ganusov, San Jose, CA (US)

(73) Assignee: Altera Corporation, San Jose, CA (US)

( * ) Notice: Subject to any disclaimer, the term of this patent is extended or adjusted under 35 U.S.C. 154(b) by 675 days.

(21) Appl. No.: 17/687,064

(22) Filed: Mar. 4, 2022

(65) Prior Publication Data

US 2022/0187370 A1   Jun. 16, 2022

(51) Int. Cl.
*G01R 31/3185* (2006.01)
*G01R 31/317* (2006.01)

(52) U.S. Cl.
CPC ......... *G01R 31/318536* (2013.01); *G01R 31/31723* (2013.01); *G01R 31/31727* (2013.01); *G01R 31/318572* (2013.01)

(58) Field of Classification Search
CPC ...... G01R 31/318536; G01R 31/31723; G01R 31/31727; G01R 31/318572; G01R 31/318583; G01R 31/318569; G06F 30/333

See application file for complete search history.

(56) References Cited

U.S. PATENT DOCUMENTS

| 9,588,176 | B1 | 3/2017 | Hutton et al. |
| 9,697,318 | B2 | 7/2017 | Hutton et al. |
| 9,798,842 | B1* | 10/2017 | Hutton ............... G06F 30/333 |
| 10,020,812 | B1* | 7/2018 | Langhammer ..... H03K 19/1738 |

* cited by examiner

*Primary Examiner* — Mark D Featherstone
*Assistant Examiner* — Rong Tang
(74) *Attorney, Agent, or Firm* — InventIQ Legal LLP; Steven J. Cahill

(57) ABSTRACT

An integrated circuit includes first and second data storage circuits, first, second, and third shadow storage circuits, and first, second, and third multiplexer circuits. The first multiplexer circuit is configurable to provide a state of a data signal from the first data storage circuit to the first shadow storage circuit in a snapshot mode. The second multiplexer circuit is coupled between an output of the second data storage circuit and an input of the second shadow storage circuit. The third multiplexer circuit is coupled to the second multiplexer circuit. The third multiplexer circuit is configurable to provide a state of an output signal of the first shadow storage circuit to an input of the third shadow storage circuit in a scan mode bypassing the second shadow storage circuit.

20 Claims, 6 Drawing Sheets

CIRCUITS AND METHODS FOR CONFIGURABLE SCAN CHAINS

FIELD OF THE DISCLOSURE

The present disclosure relates to electronic circuits, and more particularly, to circuits and methods for configurable scan chains.

BACKGROUND

Developers of integrated circuits typically need to verify that a gate-level representation of a circuit design for an integrated circuit behaves as defined in the design specification before manufacturing the integrated circuit. The goal is to locate and fix errors in the gate-level representation of the circuit design early such that expensive respins can be avoided or at least kept to a minimum. Gate-level timing simulation has traditionally been used to perform this verification step. Gate-level timing simulation uses a test bench together with a software model of the circuit design to generate output responses to different input vectors. The test bench then compares these output responses with expected results. However, the execution time of gate-level timing simulation often exceeds any practical durations, especially for very large circuit designs that can include billions of gates.

Hardware emulation of circuit designs has emerged as a faster, more practical alternative to simulation. Configurable integrated circuits are often used as a platform for performing hardware emulation of circuit designs. For this purpose, a circuit design description is compiled and implemented on one or more configurable integrated circuits, and the test bench is executed on the one or more configurable integrated circuits. Verifying the gate-level representation of a circuit design using hardware emulation reduces execution time by several orders of magnitude compared to gate-level timing simulations.

DETAILED DESCRIPTION

Figure 1:
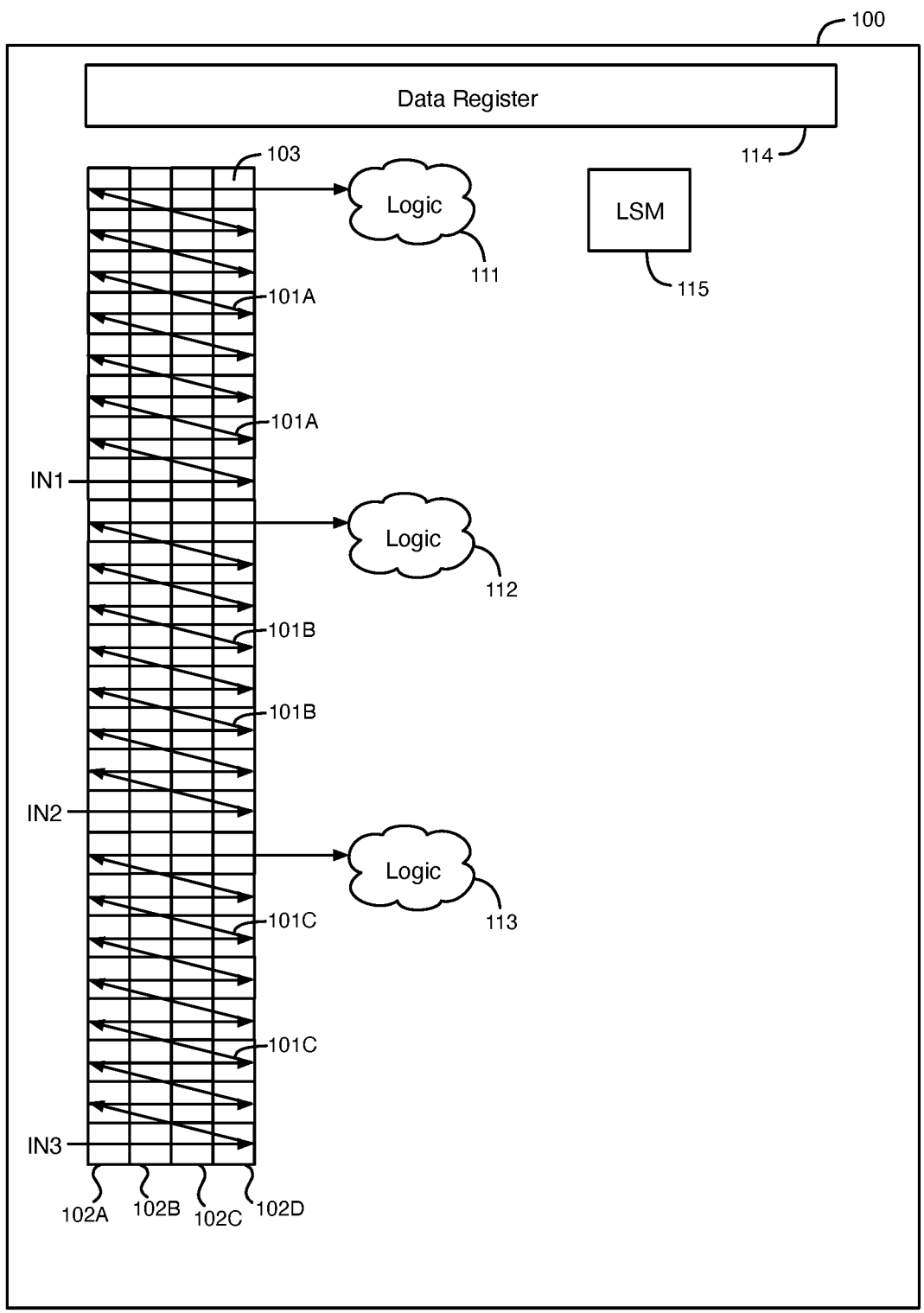
FIG. 1 is a diagram that illustrates an example of a portion of an integrated circuit containing a scan chain that is configurable and that has direct access to logic circuitry in the integrated circuit.

Configurable integrated circuits are often used as a platform for performing hardware emulation of circuit designs. After a circuit design is compiled and implemented in one or more configurable integrated circuits, a test bench may be executed on the configured integrated circuits to generate output responses to different input vectors. The test bench may then compare these output responses with expected results. The configured integrated circuits may be used in real-world operating conditions with corresponding stimuli. As an example, a traffic manager design implemented on the configured integrated circuits may be used to receive internet traffic as stimulus. If desired, the internet traffic may be slowed down to accommodate the potentially slower processing speed of the traffic manager design as implemented on the configured integrated circuits.

For debugging purposes (e.g., to localize the source of an error), the execution of the test bench on the configured integrated circuits may be interrupted. Then, a read-back operation may be performed to extract the states of the synchronous circuits in the configured integrated circuits (i.e., the values of data stored in storage circuits such as registers, latches, memories, etc.) through debug ports, such as the Internal Configuration Access Port (ICAP) or the Joint Test Action Group (JTAG) ports for further analysis.

The values of the data that are stored in the synchronous circuits may be accessible using scan storage circuits coupled in one or more scan chains. These scan storage circuits are also referred to as shadow storage circuits. For debugging purposes, it may be desirable that the read-back operation can extract the state of every synchronous circuit of the circuit design. A write-back operation may be performed to write data to synchronous circuits in the circuit design during debugging. Some existing integrated circuits use scan chains to shift data for non-destructive register read-back (RB) and write-back (WB) operations from synchronous circuits.

In some types of configurable integrated circuits, RB data may be transferred between the scan chain and the core logic circuitry of the integrated circuit through a data register and a local sector manager (LSM). The RB data transmitted through the scan chain, the data register, and the LSM to the core logic circuitry may have a long latency, for example, because the RB data may have to be transmitted at a low frequency through thousands of synchronous circuits. The RB and WB data is transmitted through the full scan chain, including through synchronous circuits that are not used in the circuit design, adding to the latency. This technique incurs significant dynamic power overhead, because 50% of all synchronous circuits in the integrated circuit are toggled during RB and WB, including any unused synchronous circuits.

According to some examples disclosed herein, a solution to the problem of long latency for accessing data in an integrated circuit through a scan chain during debugging is provided. The solution may, for example, eliminate the factors described above that can become a bottleneck limiting the maximum frequency of read-back and write-back operations through a scan chain. In some examples, a scan chain is provided that can access core logic circuitry in an integrated circuit by bypassing a data register and a local sector manager (LSM). In some examples, the scan chain is configurable, such that a user of the integrated circuit can configure the length of the scan chain. A user may, for example, configure the scan chain into smaller segments that each have a smaller latency than the entire scan chain. In addition, the dynamic power of the scan chain may be reduced substantially (e.g., by more than 10 times) using specialized logic circuits that can enable unused sequential circuits in the scan chain to be bypassed and/or the frequency of the scan chain to be increased.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

FIG. 1 is a diagram that illustrates an example of a portion of an integrated circuit 100 containing a scan chain that is configurable and that has direct access to logic circuitry in the integrated circuit. Integrated circuit (IC) 100 shown in Figure (FIG. 1 may be any type of integrated circuit, such as for example, a configurable (i.e., programmable) logic IC, a microprocessor IC, or a graphics processing unit (GPU) IC. IC 100 includes logic array blocks (LABs), logic circuits 111-113, a local sector manager (LSM) circuit 115, and a data register 114. IC 100 typically includes other circuitry not shown in FIG. 1, such as for example, memory circuits, digital signal processing circuits, additional programmable logic circuits, additional scan chains, input/output circuits, etc.

In the example of FIG. 1, IC 100 includes 4 columns 102A, 102B, 102C, and 102D of logic array blocks (LABs). Each of the columns 102A-102D includes 24 LABs arranged in 24 rows in the example of FIG. 1. Each of the LABs is shown as a box in FIG. 1, such as LAB 103 in column 102D. Each of the LABs in columns 102A-102D may, for example, include several programmable or non-programmable logic circuits. These logic circuits may, for example, include lookup-tables (LUTs) that may be configured to perform custom logic functions. These logic circuits may also include, for example, synchronous circuits, such as flip-flops.

Synchronous circuits and multiplexers in the LABs in columns 102A-102D are configurable and reconfigurable to be coupled together to form one, two, three, four, or more scan chains. In the example shown in FIG. 1, the synchronous circuits and multiplexers in the LABs in columns 102A-102D are configured to form three scan chains 101A, 101B, and 101C. Each of the scan chains 101A-101C includes synchronous circuits in 4 columns 102A-102D and 8 rows of the LABs. According to other examples, synchronous circuits in the LABs in IC 100 are configurable to form any number of scan chains. Also, each of the scan chains is configurable to have any number of LABs, any number of rows of LABs, and any number of columns of LABs. A scan chain can be configured to provide an input signal to any row of LABs and to receive an output signal from any row of LABs. As an example that is not intended to be limiting, each of the scan chains may include thousands of synchronous circuits.

Each of the scan chains 101A-101C is illustrated in FIG. 1 as a series of arrows that pass through 4 LABs in each row of LABs before proceeding to another row of LABs. The first scan chain 101A starts with input signal IN1 and proceeds up through synchronous circuits in the first 8 rows of LABs in each of the 4 columns of LABs to logic circuit 111. The second scan chain 101B starts with input signal IN2 and proceeds up through synchronous circuits in the second 8 rows of LABs in each of the 4 columns of LABs to logic circuit 112. The third scan chain 101C starts with input signal IN3 and proceeds up through synchronous circuits in the third 8 rows of LABs in each of the 4 columns of LABs to logic circuit 113. The output signals of the scan chains 101A, 101B, and 101C are provided directly to logic circuits 111, 112, and 113, respectively, without being routed through data register 114 or LSM circuit 115. Because the signals paths through the scan chains 101A-101C to logic circuits 111-113 bypass the data register 114 and the LSM circuit 115, scan chains 101A-101C are able to operate at a higher frequency (e.g., greater than 250 MHz). Each of the logic circuits 111-113 may, for example, include programmable logic circuits that can be configured to implement soft intellectual property (IP) blocks.

Figure 2:
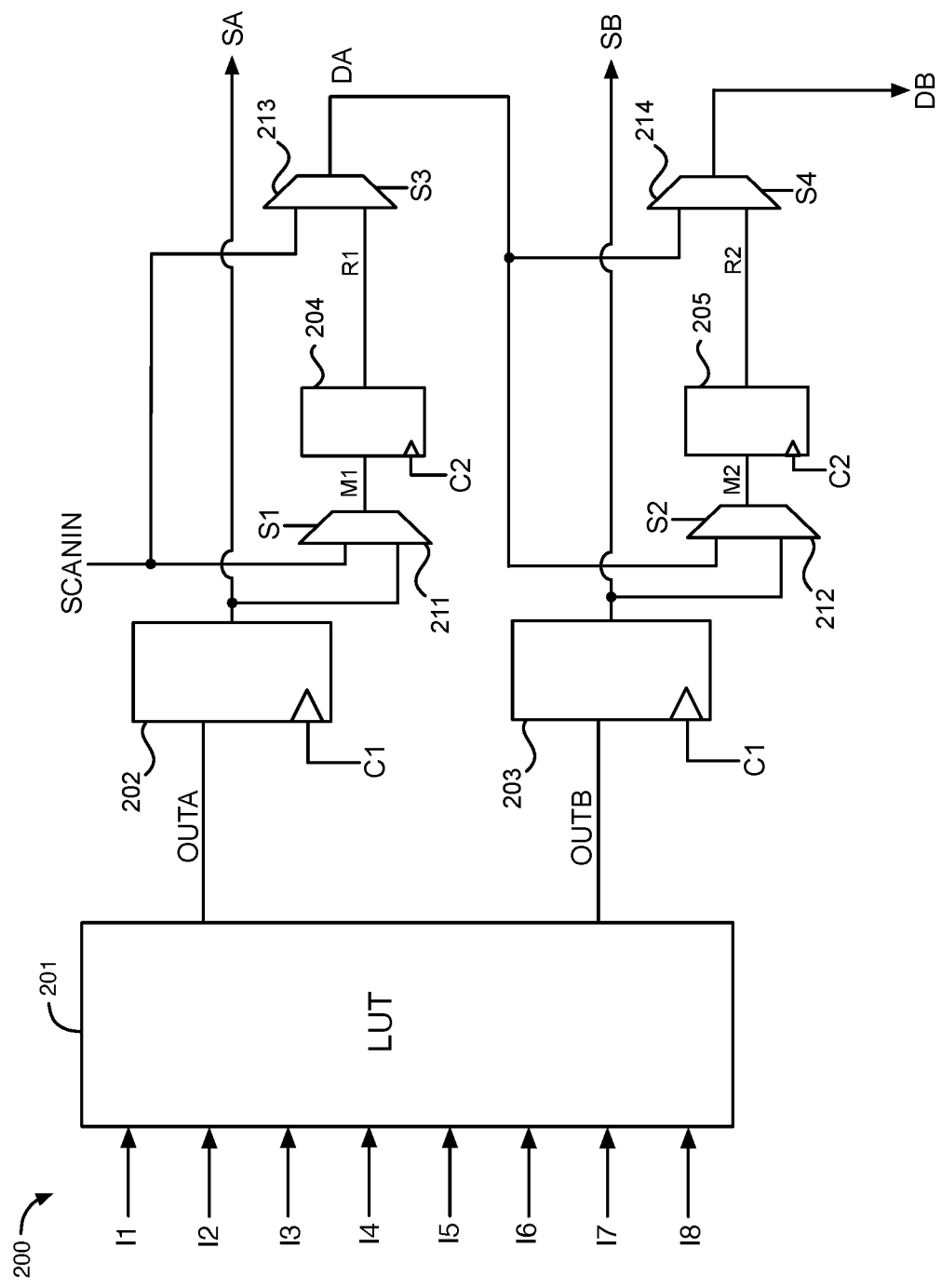
FIG. 2 is a diagram that illustrates an example of a configurable logic circuit that may be provided in a logic array block (LAB) in an integrated circuit.

FIG. 2 is a diagram that illustrates an example of a configurable logic circuit 200 that may be provided in a logic array block (LAB). In an implementation, one or more configurable logic circuits 200 may be provided in each of the LABs in IC 100 shown in FIG. 1. As a more specific example, each of the LABs shown in FIG. 1 in IC 100 may include thousands of instances of configurable logic circuits 200.

The configurable logic circuit 200 shown in FIG. 2 includes a lookup table (LUT) circuit 201, 4 flip-flops circuits 202-205, and 4 multiplexer circuits 211-214. 8 input signals I1-I8 are provided to 8 inputs of LUT circuit 201. LUT circuit 201 performs a combinatorial logic function on the states of the 8 input signals I1-I8 to generate the states of output signals OUTA and OUTB. Output signals OUTA and OUTB are provided to data inputs of flip-flop circuits 202 and 203, respectively. Flip-flop circuits 202-203 are data storage circuits that store the states of signals OUTA and OUTB at their outputs as signals SA and SB, respectively, in response to a clock signal C1. References to "state" herein may, for example, refer to a logic state of a digital signal. Flip-flop circuits 202-205 are synchronous circuits.

In an implementation of IC 100 of FIG. 1, IC 100 is a configurable integrated circuit that is used as a platform for performing hardware emulation of a circuit design during an emulation mode. In the emulation mode, a read-back operation may be performed to extract the output states of the flip-flop circuits 202-203 using flip-flop circuits 204-205. Flip-flop circuits 204-205 are scan storage circuits (also referred to herein as shadow storage circuits) that can be coupled together as a scan chain during a read-back operation and/or during a write-back operation. The scan chain that includes shadow storage circuits 204-205 is a dedicated scan chain that is used to capture and shift out data stored in flip-flop circuits 202-203 without shifting additional data into flip-flop circuits 202-203. Thus, the scan chain that includes shadow storage circuits 204-205 can perform a non-destructive capture of the data stored in flip-flop circuits 202-203 without disturbing or erasing the data stored in flip-flop circuits 202-203.

During a read-back operation, the states of one or more of the output signals SA-SB of flip-flop circuits 202-203 may be retrieved using the scan chain formed by one or both of flip-flop circuits 204-205. During a snapshot mode of a read-back operation, multiplexer circuits 211-212 may be configured by select signals S1-S2 to provide the output signals SA-SB of flip-flop circuits 202-203 to the data inputs of flip-flop circuits 204-205 as signals M1-M2, respectively. Flip-flop circuits 204-205 store the states of signals M1 and M2 at their outputs as signals R1 and R2, respectively, in response to clock signal C2 in the snapshot mode.

During a scan-out mode of the read-back operation, the multiplexer circuits 211-214 may be configured by select signals S1-S4, respectively, to provide the states of both of signals R1 and R2 through the scan chain to one or more logic circuits in IC 100. For example, multiplexer circuit 211 may be configured by signal S1 during the scan-out mode to provide an input signal SCANIN from an adjacent configurable logic circuit 200 in IC 100 (or from another input source) to the data input of flip-flop circuit 204. Also, multiplexer circuits 213 and 212 may be configured by select signals S3 and S2, respectively, during the scan-out mode to provide the state of the output signal R1 of flip-flop circuit 204 (that indicates the state of signal SA) to the data input of flip-flop 205 via signals DA and M2. In addition, multiplexer circuit 214 may be configured by select signal S4 during the scan-out mode to provide the state of the output signal R2 of flip-flop circuit 205 (that indicates the state of signal SB) to an output of circuit 200 as signal DB. Signal DB may be provided to another configurable logic circuit 200 in IC 100 or to an output of the scan chain.

In each clock cycle of clock signal C2, the state of an output signal of a data storage circuit is provided to the next shadow storage circuit in the scan chain. For example, in each clock cycle of signal C2, the state of signal SCANIN is stored in shadow storage circuit 204, the state of signal R1 is stored in shadow storage circuit 205, and the state of signal R2 is stored in a shadow storage circuit in the next configurable logic circuit 200.

In some implementations, one or more data storage circuits and their corresponding shadow storage circuits may be bypassed during a read-back operation in order to reduce the power consumption and latency of the scan chain. Data storage circuits that are unused during the emulation mode may be bypassed during a read-back operation along with their corresponding shadow storage circuits to reduce power consumption and latency. As an example, multiplexer circuits 211-214 may be configured by select signals S1-S4, respectively, to provide the state of signal SA (but not signal SB) through the scan chain to one or more logic circuits in IC 100 during a read-back operation. In this example, multiplexer circuit 211 may be configured by signal S1 during the read-back operation to provide an input signal SCANIN from an adjacent configurable logic circuit 200 in IC 100 (or from another input source) to the data input of flip-flop circuit 204 as signal M1. Also, multiplexer circuits 213 and 214 are configured by select signals S3 and S4, respectively, during the read-back operation to provide the state of the output signal R1 of flip-flop circuit 204 (that indicates the state of signal SA) to an output of circuit 200 as signal DB (via signal DA). Signal DB may be provided to multiplexer circuits 211 and 213 in another configurable logic circuit 200 as the SCANIN signal or to an output of the scan chain. In each cycle of clock signal C2 during the scan-out mode, the state of signal SCANIN is stored in shadow storage circuit 204, and the state of signals R1/DA is stored in a shadow storage circuit in a subsequent configurable logic circuit 200 coupled in the scan chain. In this example, data storage circuit 203 and shadow storage circuit 205 are bypassed during the read-back operation, and the output signal SB of data storage circuit 203 is not accessed. To further reduce power consumption and latency, the clock signals provided to the bypassed data and shadow storage circuits may be tied off.

In some examples, any number of data storage circuits and their corresponding shadow storage circuits in any number of configurable logic circuits 200 may be bypassed in order to reduce dynamic power consumption and latency in the scan chain. For example, 1-20 data storage circuits and their corresponding shadow storage circuits (e.g., in a row of LABs) may be bypassed in a set of configurable logic circuits 200 in IC 100. The bypassed data and shadow storage circuits lie between the data and shadow storage circuits that are accessed during a read-back operation.

Figure 3:
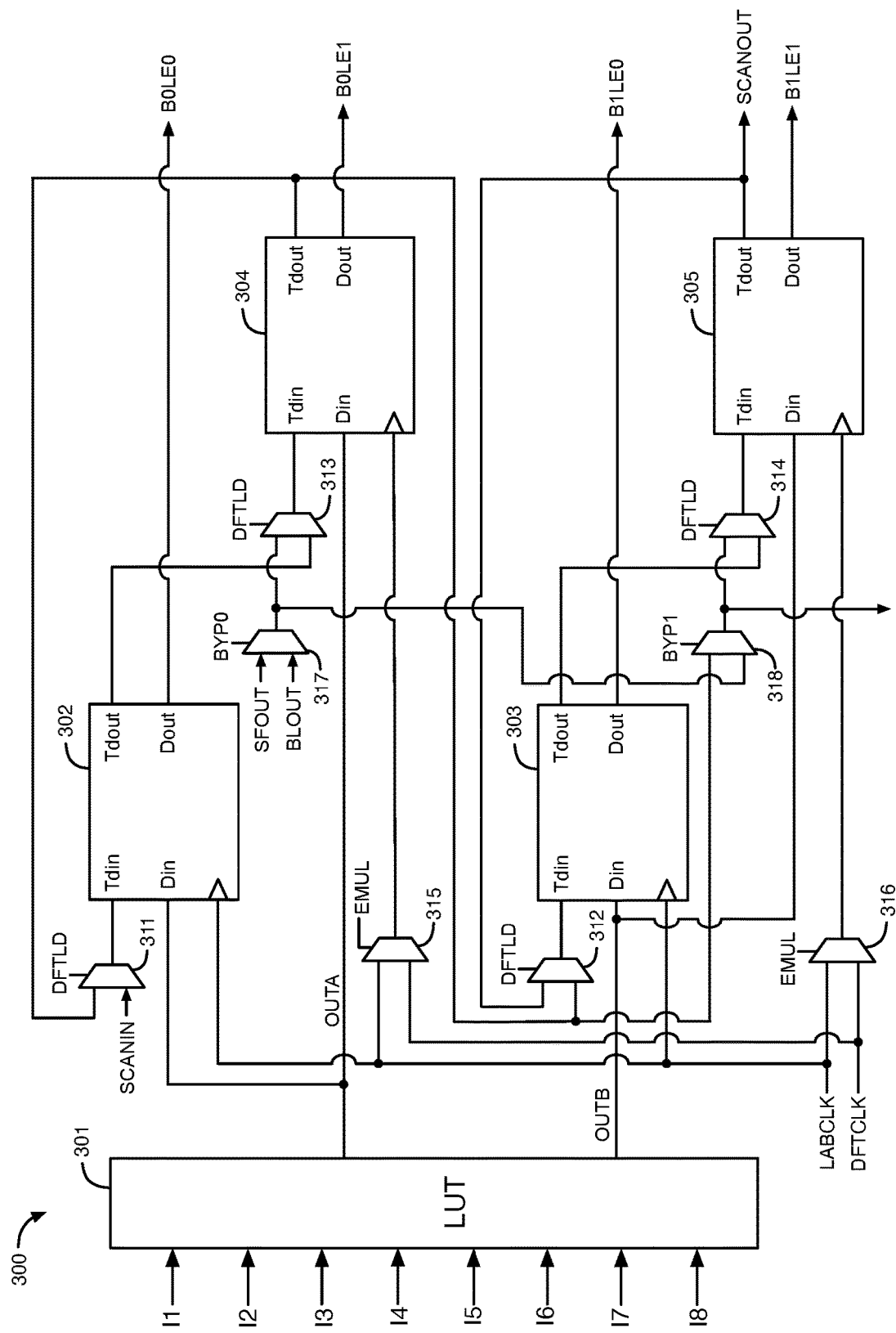
FIG. 3 is a diagram that illustrates another example of a configurable logic circuit that may be provided in a logic array block (LAB).

FIG. 3 is a diagram that illustrates another example of a configurable logic circuit 300 that may be in a logic array block (LAB) in an IC. In an implementation, one or more configurable logic circuits 300 may be in each of the LABs shown in FIG. 1. As a more specific example, each of the LABs shown in FIG. 1 may include thousands of instances of configurable logic circuit 300.

The configurable logic circuit 300 shown in FIG. 3 includes a lookup table (LUT) circuit 301, 4 flip-flops circuits 302-305, and 8 multiplexer circuits 311-318. Flip-flop circuits 302 and 303 are data storage circuits (i.e., data registers), and flip-flops 304-305 are shadow storage circuits (also referred to as scan storage circuits or shadow registers). Flip-flop circuits 304-305 may be coupled together in a scan chain during a read-back or write-back operation. The scan chain may include several other configurable logic circuits 300 in the IC. The scan chain is configurable to perform read-back operations from data storage circuits 302-303 and write-back operations to data storage circuits 302-303, as described in further detail herein with respect to FIG. 5. The scan chain is reconfigurable to provide a scan-in input signal SCANIN to any LAB coupled in the scan chain. The scan chain is also reconfigurable to provide a tap-out output signal from any of the storage circuits 304-305 (e.g., output signals B0LE1 and B1LE1) in any LAB to logic circuits in a core region of the IC. As a result, the scan chain may be configured or reconfigured to any desired length (i.e., any number of shadow storage circuits). Any of the data and shadow storage circuits that are unused in a circuit design for the IC may be bypassed by configuring multiplexers 317-318.

8 input signals I1-I8 are provided to 8 inputs of LUT circuit 301. LUT circuit 301 performs a combinatorial logic function on the states of the 8 input signals I1-I8 to generate the states of output signals OUTA and OUTB. Output signal OUTA is provided to data inputs Din of flip-flop circuits 302 and 304. Output signal OUTB is provided to data inputs Din of flip-flop circuits 303 and 305. Flip-flop circuits 302-305 are configurable to store the states of the input signals received at their Tdin or Din inputs to their Tdout and/or Dout outputs in response to the clock signals received at their clock inputs. An example of each of flip-flop circuits 302-305 is disclosed herein with respect to FIG. 4. Clock signal LABCLK is provided to the clock inputs of flip-flop circuits 302-303. Multiplexer circuits 315-316 select either clock signal LABCLK or clock signal DFTCLK in response to emulation select signal EMUL and provide the selected clock signals to the clock inputs of flip-flop circuits 304-305, respectively.

Multiplexer circuit 311 is configurable by design-for-test load signal DFTLD to provide the state of either the scan-in input signal SCANIN or the output signal from the Tdout output of flip-flop circuit 304 to the Tdin input of flip-flop circuit 302. Multiplexer circuit 317 is configurable by bypass select signal BYP0 to provide the state of one of two input signals SFOUT or BLOUT from an adjacent configurable logic circuit 300 to a data input of multiplexer circuit 313. Multiplexer circuit 313 is configurable by signal DFTLD to provide the state of either the output signal from the Tdout output of flip-flop circuit 302 or the output signal of multiplexer circuit 317 to the Tdin input of flip-flop circuit 304.

Multiplexer circuit 312 is configurable by signal DFTLD to provide the state of either the output signal from the Tdout output of flip-flop circuit 304 or the output signal from the Tdout output of flip-flop circuit 305 to the Tdin input of flip-flop circuit 303. Multiplexer circuit 318 is configurable by bypass select signal BYP1 to provide the state of either the output signal from the Tdout output of flip-flop circuit 304 or the output signal of multiplexer circuit 317 to a data input of multiplexer circuit 314. Multiplexer circuit 314 is configurable by signal DFTLD to provide the state of either the output signal from the Tdout output of flip-flop circuit 303 or the output signal of multiplexer circuit 318 to the Tdin input of flip-flop circuit 305. Flip-flop circuits 302, 303, 304, and 305 generate output signals B0LE0, B1LE0, B0LE1, and B1LE1 at their Dout outputs. Flip-flop circuit 305 also generates a SCANOUT signal at its Tdout output.

Figure 4:
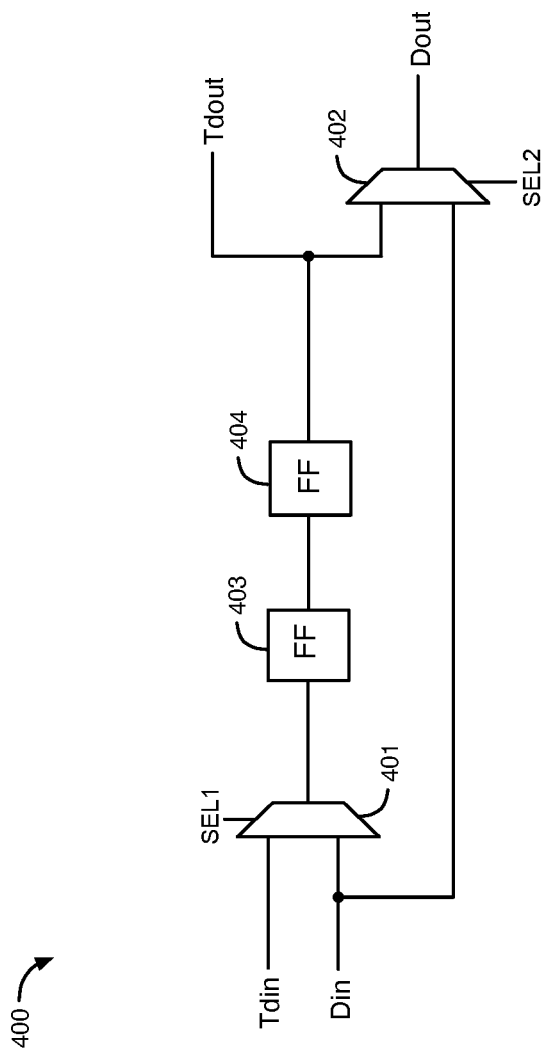
FIG. 4 is a diagram of a flip-flop circuit that is an example of each of the flip-flop circuits in the configurable logic circuit of FIG. 3.

FIG. 4 is a diagram that illustrates a flip-flop circuit 400 that is an example of each of the flip-flop circuits 302-305 in configurable logic circuit 300 of FIG. 3. The flip-flop circuit 400 of FIG. 4 includes 2 multiplexer circuits 401-402, a primary flip-flop circuit 403, and a secondary flip-flop circuit 404. The input signals at the Tdin and Din inputs of flip-flop circuit 400 are provided to the data inputs of multiplexer circuit 401. Multiplexer circuit 401 is configurable by select signal SEL1 to provide the state of one of the input signals at the Tdin or Din inputs to an input of flip-flop circuit 403. Flip-flop circuit 403 stores the state of the signal at its input (as received from multiplexer circuit 401) at the input of flip-flop circuit 404. Flip-flop circuit 404 stores the state of the signal at its input (as received from the output of flip-flop circuit 403) as an output signal at the Tdout output and at a data input of multiplexer circuit 402. Multiplexer circuit 402 is configurable by select signal SEL2 to provide the state of the signal at either the Tdout output or the Din input to output Dout of flip-flop circuit 400.

Figure 5:
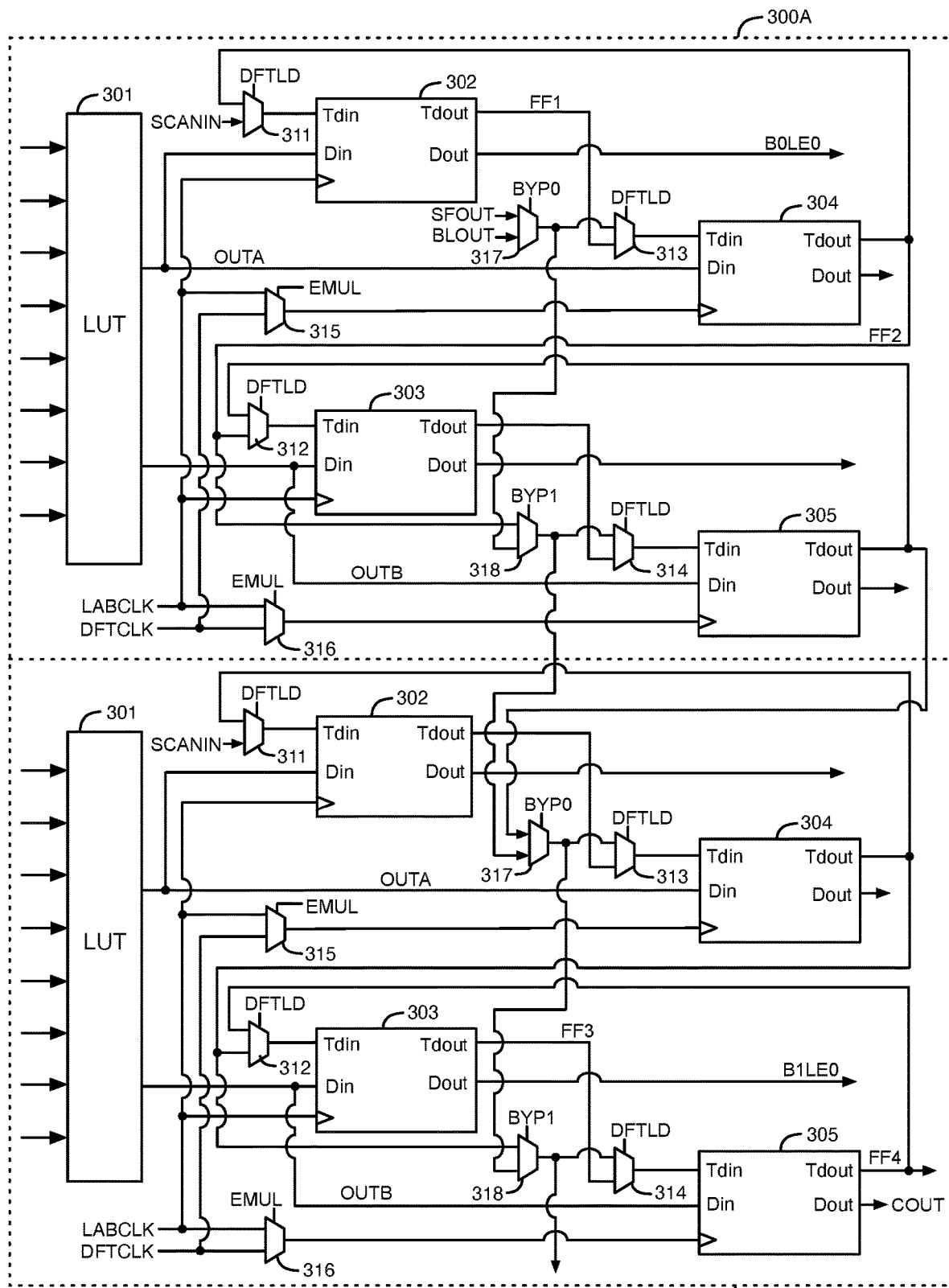
FIG. 5 is a diagram that illustrates examples of two adjacent configurable logic circuits in an integrated circuit.

FIG. 5 is a diagram that illustrates examples of two adjacent configurable logic circuits 300A-300B in an integrated circuit. Configurable logic circuits 300A and 300B are examples of the configurable logic circuit 300 of FIG. 3. Configurable logic circuits 300A-300B may, for example, be in IC 100. Each of the configurable logic circuits 300A-300B may be operated in read-back operation or in write-back operation, which are now described in further detail.

A read-back operation includes a snapshot mode and a scan-out mode. During the snapshot mode, user data generated by the LUTs 301 and stored in any of the data storage circuits 302-303 may be stored in the corresponding shadow storage circuits 304-305. During the scan-out mode, user data stored in any of the shadow storage circuits 304-305 is shifted out through the scan chain.

Examples of the snapshot and scan-out modes during a read-back operation are now described in further detail. In this example, LUT 301 in configurable logic circuit 300A generates user data in output signal OUTA, but does not generate user data at the second output that may generate output signal OUTB. Also, in this example, LUT 301 in configurable logic circuit 300B generates user data in output signal OUTB, but does not generate user data at the first output that may generate output signal OUTA. Thus, the output signal OUTB in circuit 300A and the output signal OUTA in circuit 300B are not generated or are unused in this example.

According to this example, in configurable logic circuit 300A, the DFTLD signal configures multiplexer circuit 311 to provide the SCANIN signal to the Tdin input of flip-flop circuit 302, and the DFTLD signal configures multiplexer circuit 313 to provide the output signal FF1 at the Tdout output of flip-flop circuit 302 to the Tdin input of flip-flop circuit 304 during the snapshot mode. Also, the EMUL signal configures multiplexer circuit 315 to provide the DFTCLK clock signal to the clock input of flip-flop circuit 304. In response to the LABCLK clock signal, flip-flop circuit 302 stores the state of the output signal OUTA of LUT 301 received at its Din input to its output Tdout as signal FF1. If flip-flop circuit 302 contains the architecture of flip-flop circuit 400 of FIG. 4, select signal SEL1 is set to a state that causes multiplexer circuit 401 to provide the state of the signal at the Din input to flip-flop circuit 403, and flip-flop circuit 404 stores the state of the signal from the Din input at the Tdout output. Multiplexer circuit 313 provides the state of signal FF1 to the Tdin input of flip-flop circuit 304. Flip-flop circuit 304 stores the state of the signal from its Tdin input at its Tdout output as signal FF2 in response to the DFTCLK signal during the snapshot mode. If flip-flop circuit 304 contains the architecture of flip-flop circuit 400 of FIG. 4, select signal SEL1 is set to a state that causes multiplexer circuit 401 to provide the signal at the Tdin input to flip-flop circuit 403, and flip-flop circuit 404 stores the state of the signal from the Tdin input at the Tdout output.

Also in this example in configurable logic circuit 300B, the DFTLD signal configures multiplexer circuit 314 to provide the output signal FF3 at the Tdout output of flip-flop circuit 303 to the Tdin input of flip-flop circuit 305 during the snapshot mode. Also, the EMUL signal configures multiplexer circuit 316 to provide the DFTCLK signal to the clock input of flip-flop circuit 305. In response to the LABCLK clock signal, flip-flop circuit 303 stores the state of the output signal OUTB of LUT 301 to its output Tdout as signal FF3. If flip-flop circuit 303 contains the architecture of flip-flop circuit 400 of FIG. 4, select signal SEL1 is set to a state that causes multiplexer circuit 401 to provide the signal at the Din input to flip-flop circuit 403, and flip-flop circuit 404 stores the state of the signal from the Din input at the Tdout output. Multiplexer circuit 314 provides the state of signal FF3 to the Tdin input of flip-flop circuit 305. Flip-flop circuit 305 stores the state of the signal from its Tdin input at its Tdout output as signal FF4 in response to signal DFTCLK during snapshot mode. If flip-flop circuit 305 contains the architecture of flip-flop circuit 400 of FIG. 4, select signal SEL1 is set to a state that causes multiplexer circuit 401 to provide the signal at the Tdin input to flip-flop circuit 403, and flip-flop circuit 404 stores the state of the signal from the Tdin input at the Tdout output.

During the scan-out mode in this example, user data stored in the shadow storage circuit 304 in configurable logic circuit 300A and user data stored in the shadow storage circuit 305 in configurable logic circuit 300B is shifted out through the scan chain. During the scan-out mode in configurable logic circuit 300A, the BYP0 signal configures multiplexer circuit 317 to provide the state of the SFOUT signal to a data input of multiplexer circuit 313, and the DFTLD signal configures multiplexer circuit 313 to provide the state of the SFOUT signal from multiplexer circuit 317 to the Tdin input of flip-flop circuit 304. Signal SFOUT may be the SCANOUT output signal from flip-flop 305 in another configurable logic circuit 300. Also, the EMUL signal configures multiplexer circuit 315 to provide the DFTCLK signal to the clock input of flip-flop circuit 304. Flip-flop circuit 304 stores the state of the signal from its Tdin input at its Tdout output as signal FF2 in response to the DFTCLK signal during the scan-out mode. If flip-flop circuit 304 contains the architecture of flip-flop circuit 400 of FIG. 4, select signal SEL1 is set to a state that causes multiplexer circuit 401 to provide the signal at the Tdin input to flip-flop circuit 403, and flip-flop circuit 404 stores the state of the signal from the Tdin input at the Tdout output.

Also, during the scan-out mode in configurable logic circuit 300A, the BYP1 signal configures multiplexer circuit 318 to provide the FF2 signal from the Tdout output of flip-flop circuit 304 to a data input of the multiplexer circuit 317 in configurable logic circuit 300B. Because flip-flop circuits 303 and 305 in configurable logic circuit 300A are unused in this example, multiplexer circuit 318 in circuit 300A is configured to bypass flip-flops 303 and 305. Also, during the scan-out mode, the BYP0 signal configures multiplexer circuit 317 in configurable logic circuit 300B to provide the state of the output signal of multiplexer circuit 318 in configurable logic circuit 300A (i.e., the state of signal FF2) to a data input of the multiplexer circuit 318 in configurable logic circuit 300B. Because flip-flop circuits 302 and 304 in configurable logic circuit 300B are unused in this example, multiplexer circuit 317 in circuit 300B is configured to bypass flip-flops 302 and 304. Multiplexer circuits 318 and 314 in configurable logic circuit 300B are configured by signals BYP1 and DFTLD, respectively, to provide the state of the output signal of multiplexer circuit 317 in circuit 300B (i.e., the state of signal FF2) to the Tdin input of flip-flop circuit 305.

In the scan-out mode, the EMUL signal configures multiplexer circuit 316 to provide the DFTCLK signal to the clock input of flip-flop circuit 305 in configurable logic circuit 300B. Flip-flop circuit 305 in circuit 300B stores the state of the signal from its Tdin input (i.e., the state of signal FF2) at its Dout output as signal COUT in response to the DFTCLK signal during the scan-out mode. If flip-flop circuit 305 contains the architecture of flip-flop circuit 400 of FIG. 4, select signal SEL1 is set to a state that causes multiplexer circuit 401 to provide the state of the signal at the Tdin input to flip-flop circuit 403, and select signal SEL2 is set to a state that causes multiplexer 402 to provide the state of the output signal of flip-flop circuit 404 to the Dout output. The COUT signal at the Dout output of flip-flop circuit 305 may then be provided to logic circuitry in a core logic region of the IC (e.g., one of logic circuits 111-113). Alternatively, flip-flop circuit 305 may provide the state of signal FF2 to its Tdout output as signal FF4, and signal FF4 may then be provided to another configurable logic circuit 300 coupled in the scan chain. Thus, in scan-out mode, user data stored in shadow storage circuit 304 in circuit 300A is shifted out of the scan chain via multiplexers 317, 318, and 314 and shadow storage circuit 305 in circuit 300B. The user data stored in shadow storage circuit 305 in circuit 300B from LUT 301 in circuit 300B is provided in signal COUT in a previous clock cycle. The unused shadow storage circuits (i.e., flip-flop circuit 305 in circuit 300A and flip-flop circuit 304 in circuit 300B) are bypassed.

The write-back operation includes a scan-in mode and a user storage mode. During the scan-in mode, write data may be stored in any of the shadow storage circuits 304-305 in one or more of the configurable logic circuits 300. The write data may be generated outside the IC and transmitted to the scan chain. During the user storage mode, the write data stored in any of the shadow storage circuits 304-305 is stored in the corresponding data storage circuits 302-303.

Examples of the scan-in mode and the user storage mode during a write-back operation are now described in further detail. In this example, write data is provided to the data storage circuit 302 in configurable logic circuit 300A and to data storage circuit 303 in configurable storage circuit 300B during the write-back operation. Write data is not provided to data storage circuit 303 in circuit 300A or to data storage circuit 302 in circuit 300B. As a result, shadow storage circuit 305 in circuit 300A and shadow storage circuit 304 in circuit 300B are bypassed in this example, as described below.

During the scan-in mode of a write-back operation in this example, write data is scanned in and stored in the shadow storage circuit 304 in configurable logic circuit 300A and in the shadow storage circuit 305 in configurable logic circuit 300B. During the scan-in mode in configurable logic circuit 300A, the BYP0 signal configures multiplexer circuit 317 to provide the write data indicated by the SFOUT signal to a data input of multiplexer circuit 313, and the DFTLD signal configures multiplexer circuit 313 to provide the state of the SFOUT signal from multiplexer circuit 317 to the Tdin input of flip-flop circuit 304. Signal SFOUT may be the SCANOUT output signal from flip-flop 305 in another configurable logic circuit 300. Also, the EMUL signal configures multiplexer circuit 315 to provide the DFTCLK signal to the clock input of flip-flop circuit 304. Flip-flop circuit 304 stores the state of the signal from its Tdin input at its Tdout output as signal FF2 in response to the DFTCLK signal during the scan-in mode. If flip-flop circuit 304 contains the architecture of flip-flop circuit 400 of FIG. 4, select signal SEL1 is set to a state that causes multiplexer circuit 401 to provide the signal at the Tdin input to flip-flop circuit 403, and flip-flop circuit 404 stores the state of the signal from the Tdin input at the Tdout output.

Also, during the scan-in mode, the BYP1 signal configures multiplexer circuit 318 in configurable logic circuit 300A to provide the state of the FF2 signal from the Tdout output of flip-flop circuit 304 to a data input of the multiplexer circuit 317 in configurable logic circuit 300B. Because flip-flop circuits 303 and 305 in configurable logic circuit 300A are unused in this example, multiplexer circuit 318 in circuit 300A is configured to bypass flip-flops 303 and 305. Also, during the scan-in mode, the BYP0 signal configures multiplexer circuit 317 in configurable logic circuit 300B to provide the state of the output signal of multiplexer circuit 318 in configurable logic circuit 300A (i.e., the state of signal FF2) to a data input of the multiplexer circuit 318 in configurable logic circuit 300B. Because flip-flop circuits 302 and 304 in configurable logic circuit 300B are unused in this example, multiplexer circuit 317 in circuit 300B is configured to bypass flip-flops 302 and 304. Multiplexer circuits 318 and 314 in configurable logic circuit 300B are configured by signals BYP1 and DFTLD, respectively, to provide the state of the output signal of multiplexer circuit 317 in circuit 300B (i.e., the state of signal FF2) to the Tdin input of flip-flop circuit 305.

In the scan-in mode, the EMUL signal configures multiplexer circuit 316 to provide the DFTCLK signal to the clock input of flip-flop circuit 305 in configurable logic circuit 300B. Flip-flop circuit 305 in circuit 300B stores the state of the signal from its Tdin input (i.e., the state of signal FF2) at its Tdout output as signal FF4 in response to the DFTCLK clock signal during the scan-in mode. If flip-flop circuit 305 contains the architecture of flip-flop circuit 400 of FIG. 4, select signal SEL1 is set to a state that causes multiplexer circuit 401 to provide the signal at the Tdin input to flip-flop circuit 403, and flip-flop circuit 404 stores the state of the signal from the Tdin input at the Tdout output. Signal FF4 may then be provided to another configurable logic circuit 300 coupled in the scan chain. Thus, in scan-in mode in this specific example, write data is scanned into flip-flop circuit 304 in circuit 300A and into flip-flop circuit 305 in circuit 300B. The unused shadow storage circuits (i.e., flip-flop circuit 305 in circuit 300A and flip-flop circuit 304 in circuit 300B) are bypassed.

During the user storage mode of the write-back operation in this example, the write data stored in shadow storage circuit 304 in configurable logic circuit 300A is stored in data storage circuit 302, and the write data stored in shadow storage circuit 305 in configurable logic circuit 300B is stored in data storage circuit 303. During the user storage mode of the write-back operation in configurable logic circuit 300A, multiplexer circuit 311 is configured by signal DFTLD to provide the state of the output signal FF2 from the Tdout output of flip-flop circuit 304 to the Tdin input of flip-flop circuit 302. In response to the LABCLK signal, the flip-flop circuit 302 in circuit 300A stores the state of the output signal of multiplexer circuit 311 (i.e., the state of the FF2 signal) received at its Tdin input at its Dout output as signal B0LE0 during the user storage mode. If flip-flop circuit 302 contains the architecture of flip-flop circuit 400 of FIG. 4, select signal SEL1 is set to a state that causes multiplexer circuit 401 to provide the signal at the Tdin input to flip-flop circuit 403, and the select signal SEL2 is set to a state that causes multiplexer 402 to provide the state of the signal at the output of flip-flop circuit 404 to the Dout output.

During the user storage mode of the write-back operation in configurable logic circuit 300B, multiplexer circuit 312 is configured by signal DFTLD to provide the state of the output signal FF4 from the Tdout output of flip-flop circuit 305 to the Tdin input of flip-flop circuit 303. In response to the LABCLK signal, the flip-flop circuit 303 in circuit 300B stores the state of the output signal of multiplexer circuit 312 (i.e., the state of the FF4 signal) received at its Tdin input at its Dout output as signal B1LE0 during the user storage mode. If flip-flop circuit 303 contains the architecture of flip-flop circuit 400 of FIG. 4, select signal SEL1 is set to a state that causes multiplexer circuit 401 to provide the signal at the Tdin input to flip-flop circuit 403, and the select signal SEL2 is set to a state that causes multiplexer 402 to provide the state of the signal at the output of flip-flop circuit 404 to the Dout output.

Because the circuitry of FIG. 5 allows one or more of the shadow storage circuits 304-305 that are unused to be bypassed, the latency of scanning write data into the scan chain during a write-back operation is reduced, and the latency of scanning data out of the scan chain during a read-back operation is also reduced. As a result, the throughput of data scanned into and out of the scan chain formed by configurable logic circuits 300 can be increased. For example, throughput may be increased by 10 times if 10% of the shadow storage circuits in a set of LABs are coupled in the scan chain and 90% of the shadow storage circuits are bypassed. Alternatively, bypassing one or more of the shadow storage circuits 304-305 that are unused can reduce the dynamic power consumption of the scan chain, while achieving more data throughput during read-back and write-back operations. An additional reduction in the dynamic power consumption of the scan chain can be achieved by bypassing one or more of the shadow storage circuits 304-305 that are unused and maintaining the same data throughput during read-back and write-back operations by decreasing the frequency of the clock signal provided to the shadow storage circuits 304-305.

Figure 6:
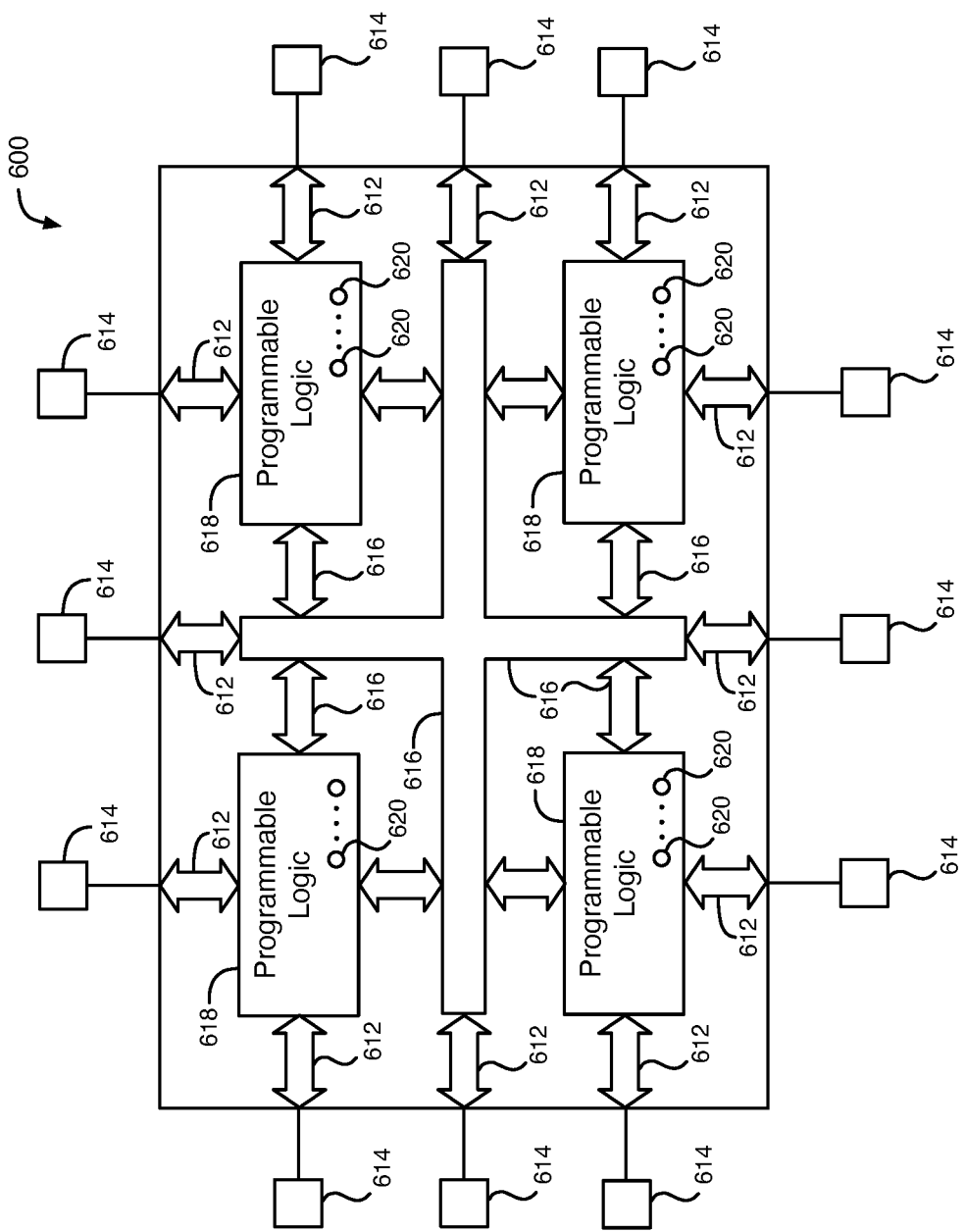
FIG. 6 is a diagram of an illustrative programmable logic integrated circuit (IC) that includes one or more LABs with configurable scan chains.

An illustrative programmable logic integrated circuit (IC) 600 that includes one or more LABs with configurable scan chains is shown in FIG. 6. As shown in FIG. 6, programmable logic integrated circuit 600 may have input-output circuitry 612 for driving signals off of IC 600 and for receiving signals from other devices via input-output pads 614. Interconnection resources 616 such as global, regional, and local vertical and horizontal conductive lines and buses may be used to route signals on IC 600.

Interconnection resources 616 include fixed interconnects (conductive lines) and programmable interconnects (i.e., programmable connections between respective fixed interconnects). Programmable logic circuitry 618 may include combinational and sequential logic circuitry. The programmable logic circuitry 618 may be configured to perform custom logic functions according to a custom design for IC 600. Programmable logic circuitry 618 may include numerous LABs, each having several of the configurable logic circuits 200 or 300.

Programmable logic IC 600 contains memory elements 620 that can be loaded with configuration data using pads 614 and input-output circuitry 612. Once loaded, the memory elements 620 may each provide a corresponding static control output signal that controls the state of an associated logic component in programmable logic circuitry 618. Typically, the memory element output signals are used to control the gates of metal-oxide-semiconductor (MOS) transistors. In the context of programmable integrated circuits, memory elements 620 store configuration data and are sometimes referred to as configuration random-access memory (CRAM) cells.

In general, software and data for performing any of the functions disclosed herein may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Additional examples are now disclosed. Example 1 is an integrated circuit comprising: first and second data storage circuits; first, second, and third shadow storage circuits; a first multiplexer circuit configurable to provide a state of a first data signal from the first data storage circuit to the first shadow storage circuit in a first snapshot mode; a second multiplexer circuit coupled between an output of the second data storage circuit and an input of the second shadow storage circuit; and a third multiplexer circuit coupled to the second multiplexer circuit, wherein the third multiplexer circuit is configurable to provide a state of an output signal of the first shadow storage circuit to an input of the third shadow storage circuit in a scan mode bypassing the second shadow storage circuit.

In Example 2, the integrated circuit of Example 1 may optionally include, wherein the second multiplexer circuit is configurable to provide a second data signal from the second data storage circuit to the second shadow storage circuit in a second snapshot mode.

In Example 3, the integrated circuit of any one of Examples 1-2 may optionally include, wherein the first multiplexer circuit provides a scan signal to the first shadow storage circuit in the scan mode.

In Example 4, the integrated circuit of any one of Examples 1-3 may further comprise: a third data storage circuit; and a fourth multiplexer circuit configurable to provide a state of a second data signal from the third data storage circuit to the third shadow storage circuit in the first snapshot mode.

In Example 5, the integrated circuit of any one of Examples 1-3 may further comprise: a fourth multiplexer circuit configurable to provide the state of the output signal of the first shadow storage circuit to an input of the first data storage circuit in a user storage mode; a third data storage circuit; and a fifth multiplexer circuit configurable to provide a state of an output signal of the third shadow storage circuit to an input of the third data storage circuit in the user storage mode.

In Example 6, the integrated circuit of any one of Examples 1-3 may further comprise: a third data storage circuit; a fourth shadow storage circuit; a fourth multiplexer circuit coupled between an output of the third data storage circuit and an input of the fourth shadow storage circuit; and a fifth multiplexer circuit coupled to the fourth multiplexer circuit, wherein the fifth multiplexer circuit is configurable to provide a state of an output signal of the third multiplexer circuit to the input of the third shadow storage circuit in the scan mode bypassing the second shadow storage circuit and the fourth shadow storage circuit.

In Example 7, the integrated circuit of Example 6 may optionally include, wherein the fourth multiplexer circuit is configurable to provide a second data signal from the output of the third data storage circuit to the fourth shadow storage circuit in a second snapshot mode.

In Example 8, the integrated circuit of any one of Examples 1-7 may optionally include, wherein the first and the second data storage circuits store data in response to a first clock signal, and wherein the first, the second, and the third shadow storage circuits store data in response to a second clock signal that is different from the first clock signal.

In Example 9, the integrated circuit of any one of Examples 1-8 may further comprise: a core logic region comprising programmable logic circuitry, wherein interconnects are configurable to couple the third shadow storage circuit to the programmable logic circuitry.

In Example 10, the integrated circuit of any one of Examples 1-3 may further comprise: a fourth multiplexer circuit comprising a first input coupled to an output of the second shadow storage circuit and a second input coupled to an output of the third multiplexer circuit, wherein the fourth multiplexer circuit is configurable to provide the state of the output signal of the first shadow storage circuit from the third multiplexer circuit to the input of the third shadow storage circuit in the scan mode.

Example 11 is an integrated circuit comprising: first and second data storage circuits; first, second, and third shadow storage circuits; a first multiplexer circuit coupled between an output of the first shadow storage circuit and an input of the first data storage circuit; a second multiplexer circuit coupled between an output of the second shadow storage circuit and an input of the second data storage circuit; and a third multiplexer circuit coupled to the second multiplexer circuit, wherein the third multiplexer circuit is configurable to provide a state of an output signal of the first shadow storage circuit to an input of the third shadow storage circuit in a scan mode bypassing the second shadow storage circuit, and wherein the first multiplexer circuit is configurable to provide the state of the output signal of the first shadow storage circuit to the input of the first data storage circuit in a first user storage mode.

In Example 12, the integrated circuit of Example 11 may further comprise: a third data storage circuit; and a fourth multiplexer circuit configurable to provide a state of an output signal of the third shadow storage circuit to an input of the third data storage circuit in the first user storage mode.

In Example 13, the integrated circuit of Example 11 may further comprise: a third data storage circuit; a fourth shadow storage circuit; a fourth multiplexer circuit coupled between an output of the fourth shadow storage circuit and an input of the third data storage circuit; and a fifth multiplexer circuit coupled to the third multiplexer circuit, wherein the fifth multiplexer circuit is configurable to provide a state of an output signal of the third multiplexer circuit to the input of the third shadow storage circuit in the scan mode bypassing the second shadow storage circuit and the fourth shadow storage circuit.

In Example 14, the integrated circuit of any one of Examples 11-13 may optionally include, wherein the second multiplexer circuit is configurable to provide a state of a signal at the output of the second shadow storage circuit to the input of the second data storage circuit in a second user storage mode that occurs at a different time than the first user storage mode.

In Example 15, the integrated circuit of any one of Examples 11-14 may further comprise: a core logic region comprising first and second logic circuits, wherein the output of the first shadow storage circuit is coupled to the first logic circuit, and wherein the third shadow storage circuit comprises an output that is coupled to the second logic circuit.

Example 16 a method for reading data from configurable logic circuits, wherein the method comprises: configuring a first multiplexer circuit to provide a state of a first data signal from a first data storage circuit to a first shadow storage circuit in a snapshot mode, wherein a second multiplexer circuit is coupled between an output of a second data storage circuit and an input of a second shadow storage circuit; and configuring a third multiplexer circuit to provide a state of an output signal of the first shadow storage circuit to an input of a third shadow storage circuit in a scan mode bypassing the second shadow storage circuit, wherein the third multiplexer circuit is coupled to the second multiplexer circuit.

In Example 17, the method of Example 16 may further comprise: configuring a fourth multiplexer circuit to provide a state of a second data signal from a third data storage circuit to the third shadow storage circuit in the snapshot mode.

In Example 18, the method of Example 16 may further comprise: configuring a fourth multiplexer circuit to provide the state of the output signal of the first shadow storage circuit from the third multiplexer circuit to the input of the third shadow storage circuit in the scan mode bypassing the second shadow storage circuit and a fourth shadow storage circuit, wherein a fifth multiplexer circuit is coupled to an output of a third data storage circuit, an output of the fourth multiplexer circuit, and an input of the fourth shadow storage circuit.

In Example 19, the method of Example 16 may further comprise: configuring a fourth multiplexer circuit to provide the state of the output signal of the first shadow storage circuit to an input of the first data storage circuit in a user storage mode; and configuring a fifth multiplexer circuit to provide a state of an output signal of the third shadow storage circuit to an input of a third data storage circuit in the user storage mode.

In Example 20, the method of any one of Examples 16-19 may further comprise: storing data in the first and the second data storage circuits in response to a first clock signal; and storing data in the first, the second, and the third shadow storage circuits in response to a second clock signal that is different from the first clock signal during the scan mode.

It will be recognized by one skilled in the art, that the examples disclosed herein may be practiced without some or all of these specific details. In other instances, well-known operations have not been described in detail in order not to unnecessarily obscure the present examples. It should be appreciated that the examples disclosed herein can be implemented in numerous ways, such as a process, an apparatus, a system, a device, or a method on a computer readable medium.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. An integrated circuit comprising:
   first and second data storage circuits;
   first, second, and third shadow storage circuits;
   a first multiplexer circuit configurable to provide a state of a first data signal from the first data storage circuit to the first shadow storage circuit in a first snapshot mode;
   a second multiplexer circuit coupled between an output of the second data storage circuit and an input of the second shadow storage circuit; and
   a third multiplexer circuit coupled to the second multiplexer circuit, wherein the third multiplexer circuit is configurable to provide a state of an output signal of the first shadow storage circuit to an input of the third shadow storage circuit in a scan mode bypassing the second shadow storage circuit.

2. The integrated circuit of claim 1, wherein the second multiplexer circuit is configurable to provide a second data signal from the second data storage circuit to the second shadow storage circuit in a second snapshot mode.

3. The integrated circuit of claim 1, wherein the first multiplexer circuit provides a scan signal to the first shadow storage circuit in the scan mode.

4. The integrated circuit of claim 1 further comprising:
   a third data storage circuit; and
   a fourth multiplexer circuit configurable to provide a state of a second data signal from the third data storage circuit to the third shadow storage circuit in the first snapshot mode.

5. The integrated circuit of claim 1 further comprising:
   a fourth multiplexer circuit configurable to provide the state of the output signal of the first shadow storage circuit to an input of the first data storage circuit in a user storage mode;
   a third data storage circuit; and
   a fifth multiplexer circuit configurable to provide a state of an output signal of the third shadow storage circuit to an input of the third data storage circuit in the user storage mode.

6. The integrated circuit of claim 1 further comprising:
   a third data storage circuit;
   a fourth shadow storage circuit;
   a fourth multiplexer circuit coupled between an output of the third data storage circuit and an input of the fourth shadow storage circuit; and
   a fifth multiplexer circuit coupled to the fourth multiplexer circuit, wherein the fifth multiplexer circuit is configurable to provide a state of an output signal of the third multiplexer circuit to the input of the third shadow storage circuit in the scan mode bypassing the second shadow storage circuit and the fourth shadow storage circuit.

7. The integrated circuit of claim 6, wherein the fourth multiplexer circuit is configurable to provide a second data signal from the output of the third data storage circuit to the fourth shadow storage circuit in a second snapshot mode.

8. The integrated circuit of claim 1, wherein the first and the second data storage circuits store data in response to a first clock signal, and wherein the first, the second, and the third shadow storage circuits store data in response to a second clock signal that is different from the first clock signal.

9. The integrated circuit of claim 1 further comprising:
   a core logic region comprising programmable logic circuitry, wherein interconnects are configurable to couple the third shadow storage circuit to the programmable logic circuitry.

10. The integrated circuit of claim 1 further comprising:
    a fourth multiplexer circuit comprising a first input coupled to an output of the second shadow storage circuit and a second input coupled to an output of the third multiplexer circuit, wherein the fourth multiplexer circuit is configurable to provide the state of the output signal of the first shadow storage circuit from the third multiplexer circuit to the input of the third shadow storage circuit in the scan mode.

11. An integrated circuit comprising:
    first and second data storage circuits;
    first, second, and third shadow storage circuits;
    a first multiplexer circuit coupled between an output of the first shadow storage circuit and an input of the first data storage circuit;
    a second multiplexer circuit coupled between an output of the second shadow storage circuit and an input of the second data storage circuit; and
    a third multiplexer circuit coupled to the second multiplexer circuit, wherein the third multiplexer circuit is configurable to provide a state of an output signal of the first shadow storage circuit to an input of the third shadow storage circuit in a scan mode bypassing the second shadow storage circuit, and wherein the first multiplexer circuit is configurable to provide the state of the output signal of the first shadow storage circuit to the input of the first data storage circuit in a first user storage mode.

12. The integrated circuit of claim 11 further comprising:
    a third data storage circuit; and
    a fourth multiplexer circuit configurable to provide a state of an output signal of the third shadow storage circuit to an input of the third data storage circuit in the first user storage mode.

13. The integrated circuit of claim 11 further comprising:
    a third data storage circuit;
    a fourth shadow storage circuit;
    a fourth multiplexer circuit coupled between an output of the fourth shadow storage circuit and an input of the third data storage circuit; and
    a fifth multiplexer circuit coupled to the third multiplexer circuit, wherein the fifth multiplexer circuit is configurable to provide a state of an output signal of the third multiplexer circuit to the input of the third shadow storage circuit in the scan mode bypassing the second shadow storage circuit and the fourth shadow storage circuit.

14. The integrated circuit of claim 11, wherein the second multiplexer circuit is configurable to provide a state of a signal at the output of the second shadow storage circuit to the input of the second data storage circuit in a second user storage mode that occurs at a different time than the first user storage mode.

15. The integrated circuit of claim 11 further comprising:
    a core logic region comprising first and second logic circuits, wherein the output of the first shadow storage circuit is coupled to the first logic circuit, and wherein the third shadow storage circuit comprises an output that is coupled to the second logic circuit.

16. A method for reading data from configurable logic circuits, wherein the method comprises:
configuring a first multiplexer circuit to provide a state of a first data signal from a first data storage circuit to a first shadow storage circuit in a snapshot mode, wherein a second multiplexer circuit is coupled between an output of a second data storage circuit and an input of a second shadow storage circuit; and
configuring a third multiplexer circuit to provide a state of an output signal of the first shadow storage circuit to an input of a third shadow storage circuit in a scan mode bypassing the second shadow storage circuit, wherein the third multiplexer circuit is coupled to the second multiplexer circuit.

17. The method of claim 16 further comprising:
configuring a fourth multiplexer circuit to provide a state of a second data signal from a third data storage circuit to the third shadow storage circuit in the snapshot mode.

18. The method of claim 16 further comprising:
configuring a fourth multiplexer circuit to provide the state of the output signal of the first shadow storage circuit from the third multiplexer circuit to the input of the third shadow storage circuit in the scan mode bypassing the second shadow storage circuit and a fourth shadow storage circuit, wherein a fifth multiplexer circuit is coupled to an output of a third data storage circuit, an output of the fourth multiplexer circuit, and an input of the fourth shadow storage circuit.

19. The method of claim 16 further comprising:
configuring a fourth multiplexer circuit to provide the state of the output signal of the first shadow storage circuit to an input of the first data storage circuit in a user storage mode; and
configuring a fifth multiplexer circuit to provide a state of an output signal of the third shadow storage circuit to an input of a third data storage circuit in the user storage mode.

20. The method of claim 16 further comprising:
storing data in the first and the second data storage circuits in response to a first clock signal; and
storing data in the first, the second, and the third shadow storage circuits in response to a second clock signal that is different from the first clock signal during the scan mode.

* * * * *